United States Patent
Teng et al.

(10) Patent No.: US 7,482,186 B2
(45) Date of Patent: Jan. 27, 2009

(54) METHOD FOR FABRICATING ACTIVE MATRIX ORGANIC LIGHT EMITTING DIODE DISPLAY DEVICE AND STRUCTURE OF SUCH DEVICE

(75) Inventors: Te-Hua Teng, Taoyuan County (TW); Chia-Chien Chen, Taipei (TW); Fang-Yi Lu, Taoyuan County (TW); Bing-Wei Wu, Taoyuan County (TW); Yun-Pei Yang, Changhua County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 196 days.

(21) Appl. No.: 11/308,561

(22) Filed: Apr. 7, 2006

(65) Prior Publication Data
US 2007/0238218 A1 Oct. 11, 2007

(51) Int. Cl.
*H01L 21/00* (2006.01)
(52) U.S. Cl. .............. 438/29; 438/99; 257/E21.024
(58) Field of Classification Search ............ 438/24, 438/29, 34, 82, 99
See application file for complete search history.

(56) References Cited

U.S. PATENT DOCUMENTS

| 6,515,428 B1* | 2/2003 | Yeh et al. ............ 315/169.3 |
| 6,727,964 B2 | 4/2004 | Tanaka et al. |
| 6,879,110 B2* | 4/2005 | Koyama ............ 315/169.1 |
| 2002/0033912 A1* | 3/2002 | Tanaka et al. ............ 349/106 |

* cited by examiner

*Primary Examiner*—Charles D. Garber
*Assistant Examiner*—Reema Patel
(74) *Attorney, Agent, or Firm*—Jianq Chyun IP Office (57) ABSTRACT

A method for fabricating an AMOLED display device is provided. A substrate is provided. A device layer having multiple active devices is formed on the substrate. A flat layer is configured on the device layer. A first, a second and a third color photoresistant layers are respectively configured on the flat layer and are patterned to form a first, a second and a third color filter layers. The first, the second and the third color filter layers respectively define a first, a second and a third pixel areas and are used for etching masks to etch the flat layer for exposing parts of the active devices. A first, a second and a third pixel electrode are respectively configured in the mentioned pixel areas and are electrically connected with the active devices. A first, a second and a third organic light emitting layers are respectively configured on the mentioned pixel electrodes.

6 Claims, 11 Drawing Sheets

METHOD FOR FABRICATING ACTIVE MATRIX ORGANIC LIGHT EMITTING DIODE DISPLAY DEVICE AND STRUCTURE OF SUCH DEVICE

BACKGROUND OF THE INVENTION

1. Field of the Invention

The present invention relates to a method for fabricating an Active Matrix Organic Light Emitting Diode (AMOLED) display device and a structure of such device, and particularly to a method for fabricating an AMOLED display device and a structure thereof, in which color filter layers are processed by a half-tone mask.

2. Description of Related Art

An Organic Light Emitting Diode (OLED) is a semiconductor device capable of efficiently converting electrical energy into optical energy. OLEDs are wildly used as luminous elements in indication lights, display panels and optical reading/writing heads. Wherein, OLED display devices, having advantages such as free-viewing angles, simple processing, low production cost, fast response, wide operation temperature range and full color displaying, meet the demands of modern display devices in the multimedia field. So, in recent years, OLEDs are being enthusiastically researched and developed.

An AMOLED display device having a structure of color filter on array (COA) has been proposed. The fabricating methods and structures related to the AMOLED are also developed and proposed by many scholars. FIGS. 1A through 1F are schematic cross-sectional views illustrating a process for fabricating a conventional AMOLED display device having a structure of COA.

Figure 1A:
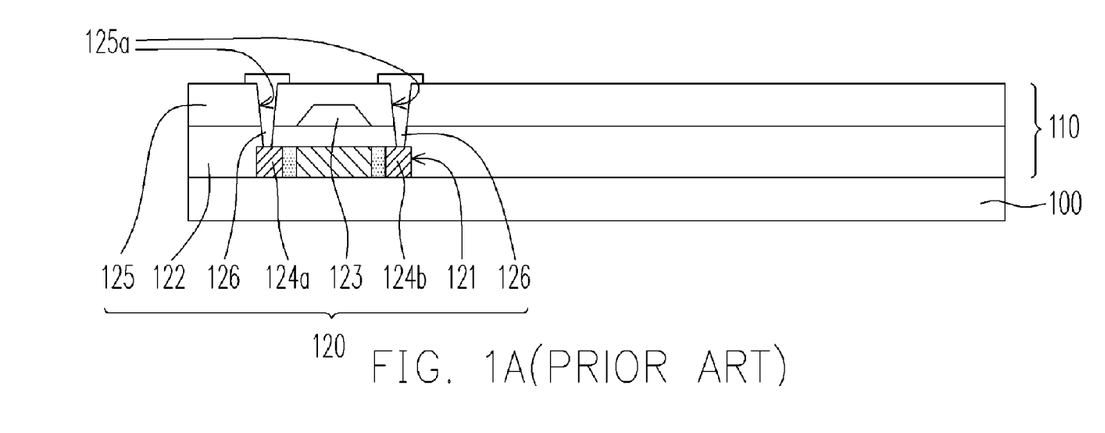
FIGS. 1A through 1F are schematic cross-sectional views illustrating a process for fabricating a conventional AMOLED display device having a structure of COA.

Referring to FIG. 1A, a substrate 100 is prepared. The substrate 100 has a device layer 110 configured thereon. The device layer 110 includes a plurality of thin film transistors (TFT) 120 (only one exemplarily shown), a plurality of scan lines (not shown) and a plurality of data lines (not shown). The TFTs 120 are driven by the scan lines and the data lines.

Referring to FIG. 1A, each TFT 120 includes a silicon island 121, a gate-insulating layer 122, a gate electrode 123, a source electrode 124a, a drain electrode 124b, an inter-layer dielectric (ILD) layer 125, and a source/drain contact metal 126. The ILD layer 125 has an opening 125a configured for exposing the source electrode 124a and the drain electrode 124b of the TFT 120. The source/drain contact metal 126 is electrically connected with the source electrode 124a and the drain electrode 124b. The source/drain contact metal 126 is adapted for electrically connecting the TFT 120 with a sequentially formed transparent conductive layer 150.

Figure 1B:
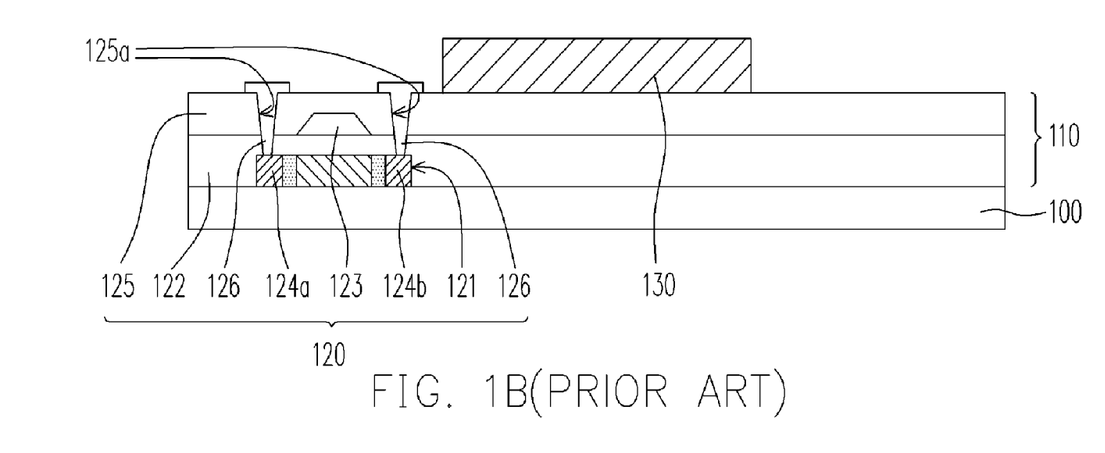

Referring to FIG. 1B, the ILD layer 125 is taken as a buffer layer for making a color filter array, that is the foregoing mentioned COA structure. Three times of procedures including coating color light resistant, exposing and photolithography are processed for respectively forming a red color filter layer 130, a green color filter layer (not shown) and a blue color filter layer (not shown) on the ILD layer 125. It is to be noted that the positions of the red color filter layer 130, the green color filter layer and the blue color filter layer are respectively corresponding to the subsequently formed pixel areas 162.

Figure 1C:
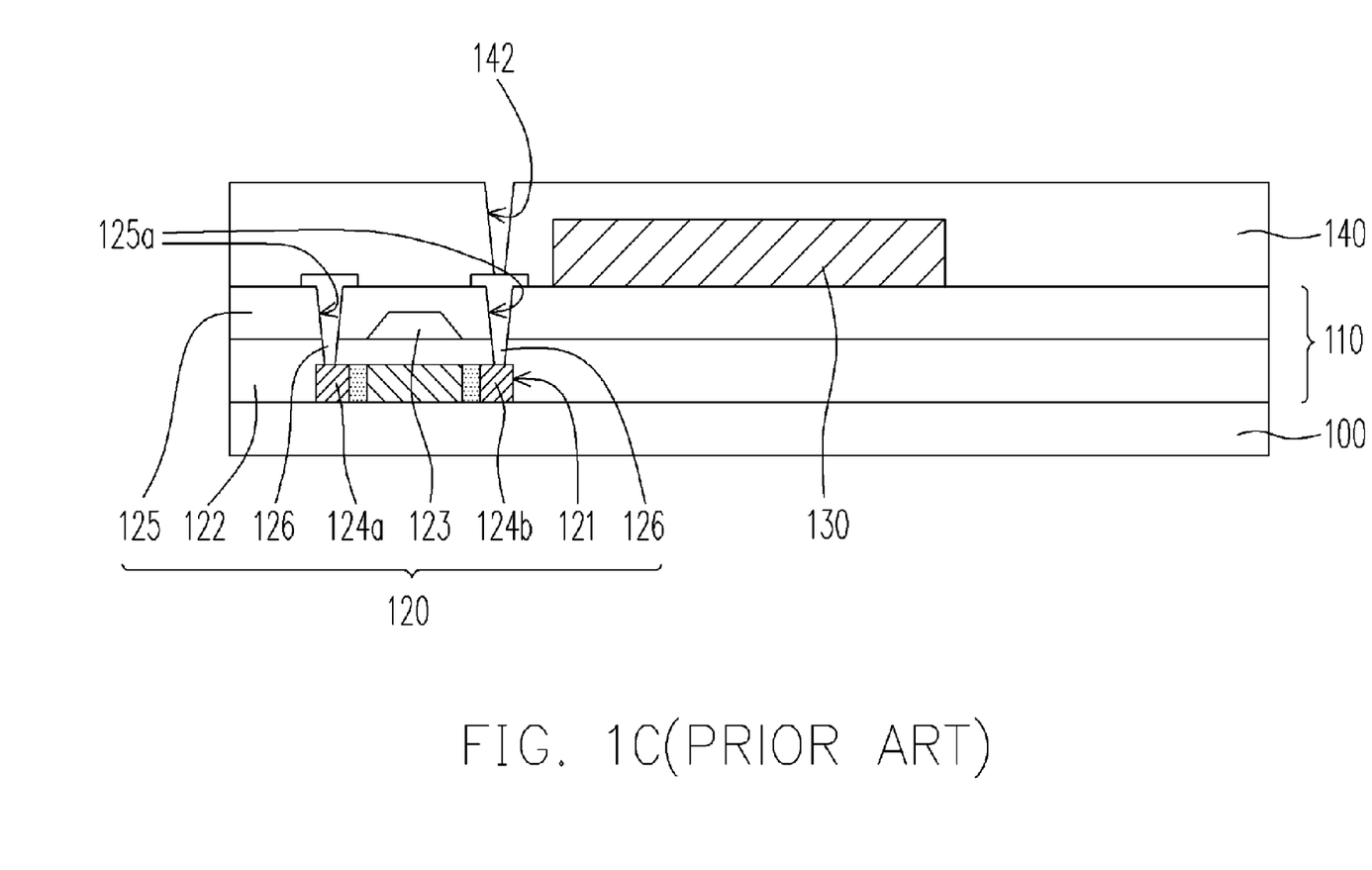

Now referring to FIG. 1C, a flat layer 140 is then formed on the substrate 100. The flat layer 140 covers the red color filter layer 130, the green color filter layer (not shown) and the blue color filter layer (not shown). Then, the flat layer 140 is patterned for forming a contact window opening 142, which exposes the source/drain contact metal 126.

Figure 1D:
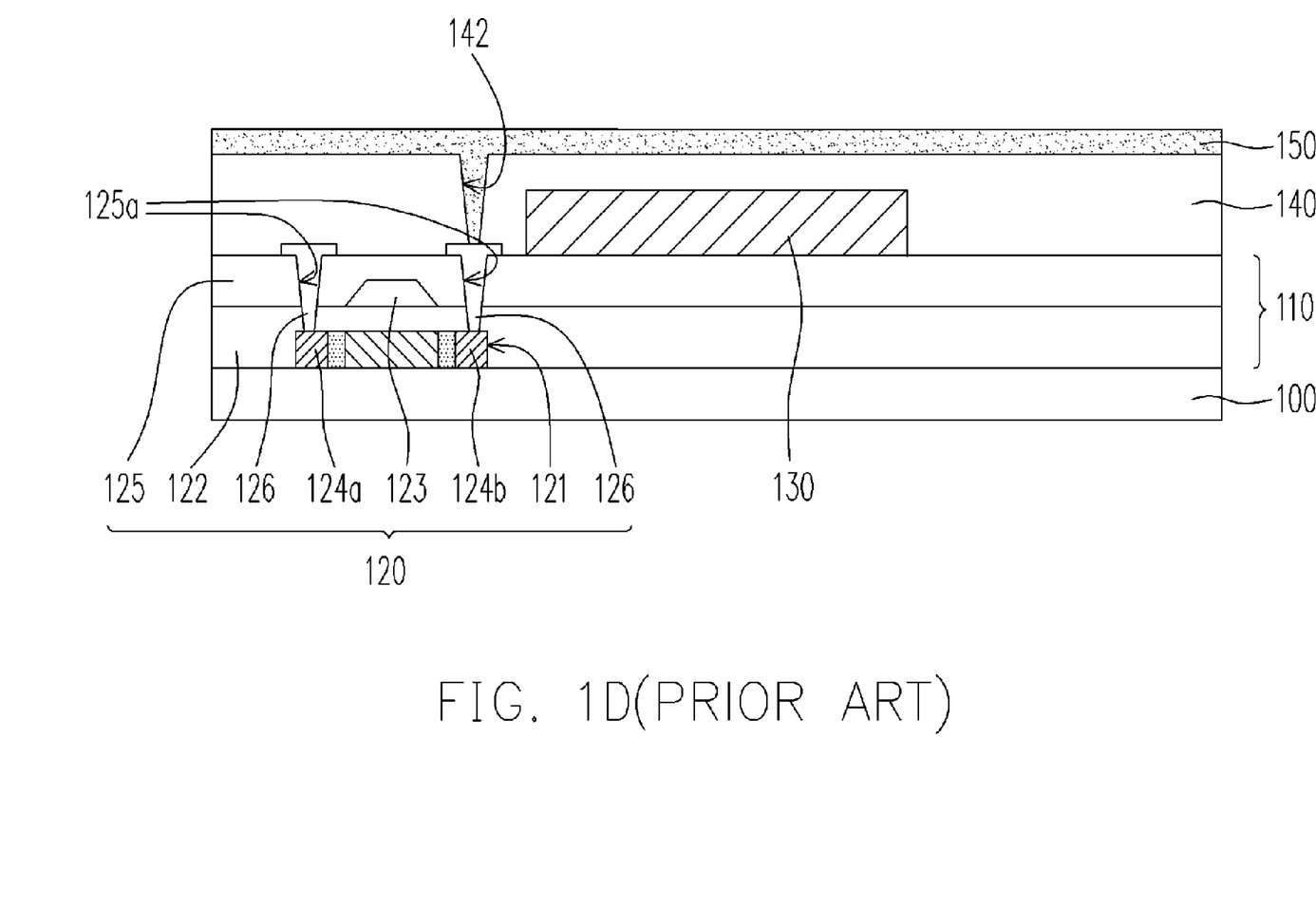

Referring to FIG. 1D, a transparent conductive layer 150 is formed on the flat layer 140. The transparent conductive layer 150 is electrically connected with the source/drain contact metal 126 via the contact window opening 142.

Figure 1E:
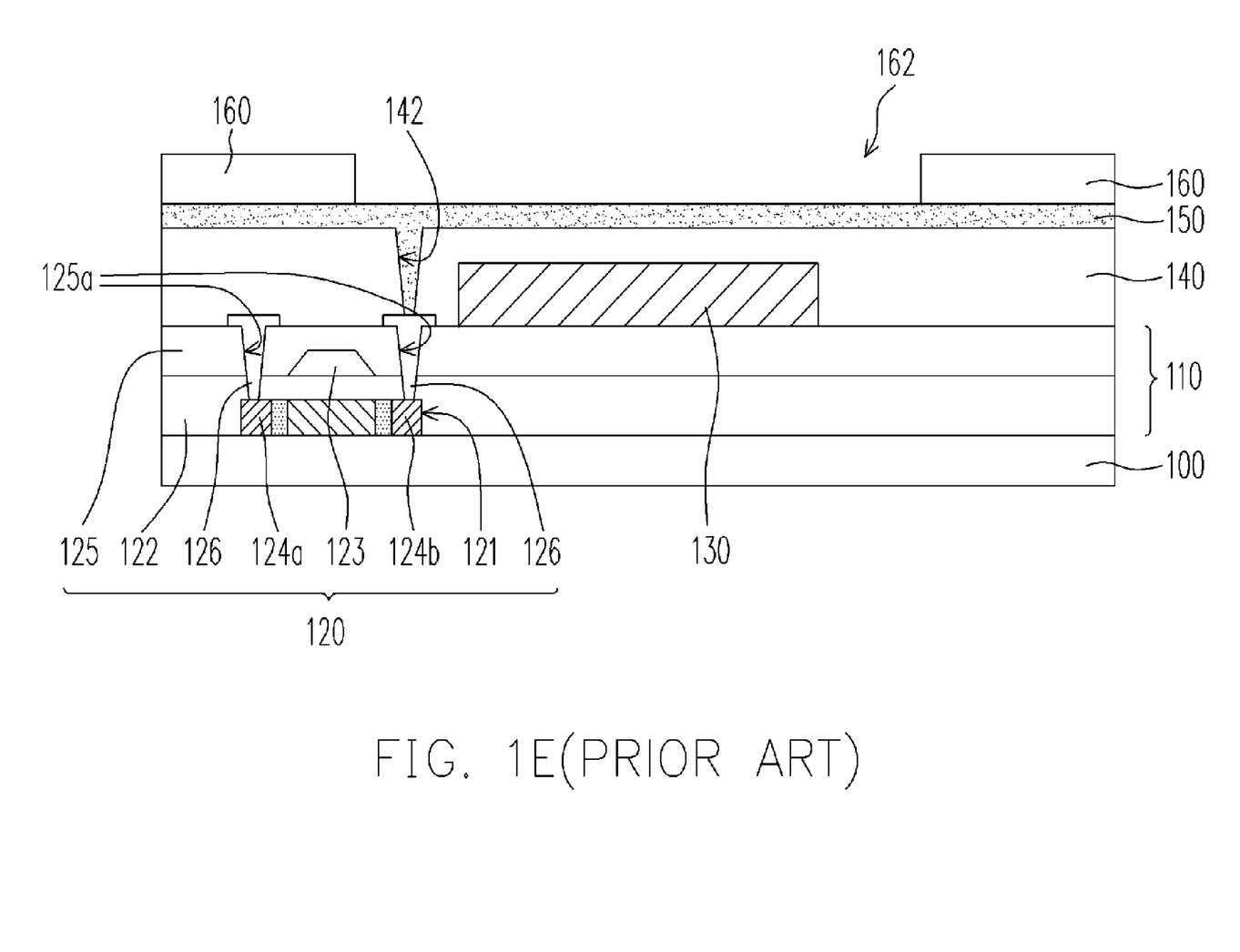

Referring to FIG. 1E, a pixel defining layer 160 is then formed on the transparent conductive layer 150, for defining a plurality of pixel areas. The pixel defining layer 160 is generally formed by either coating an organic photoresistant layer, followed by exposure and photolithography; or coating an inorganic layer and then processing procedures of photolithography and etching.

Figure 1F:
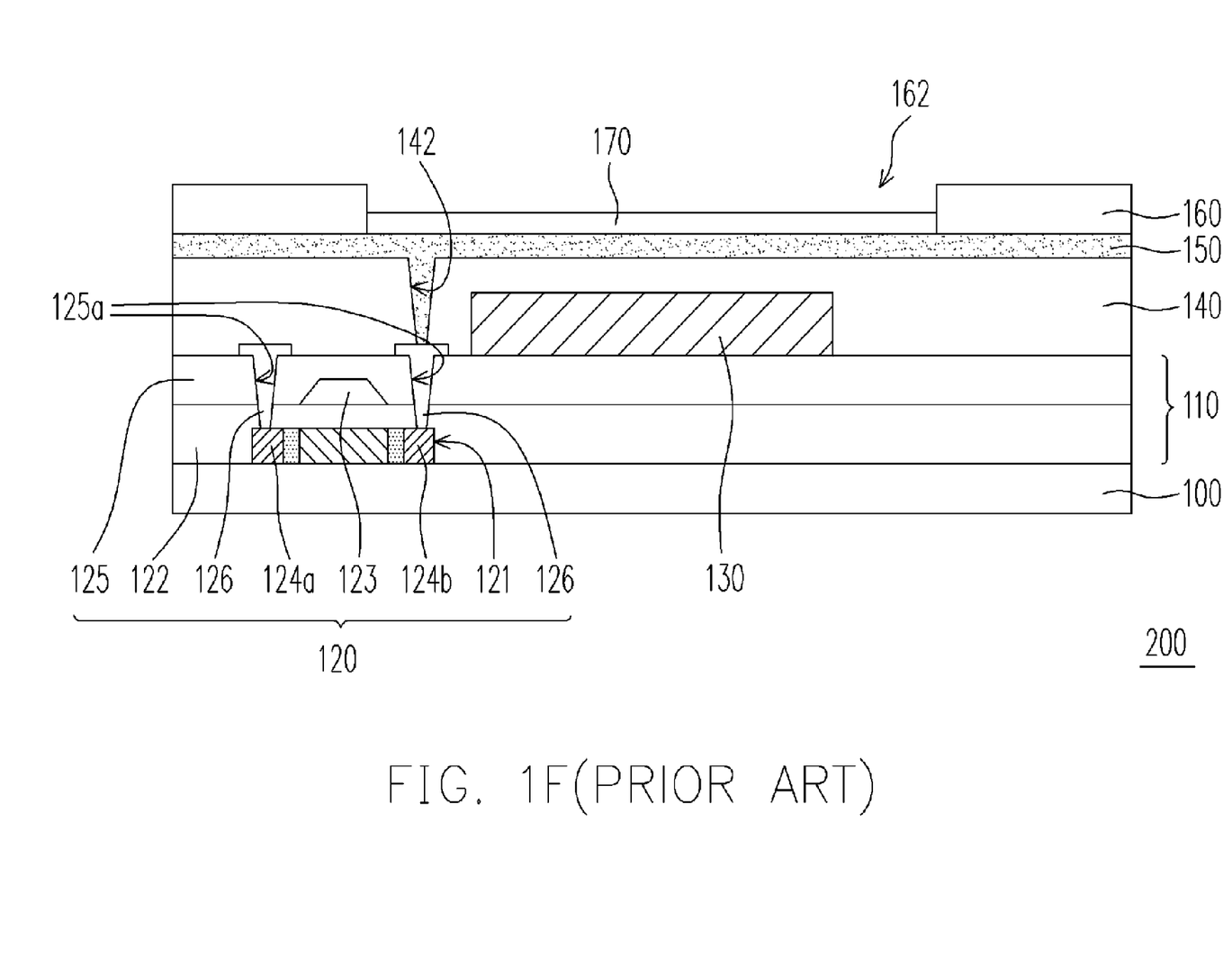

Then referring to FIG. 1F, an organic light emitting layer 170 is formed in the pixel area 162 and thus completing the fabrication of the AMOLED display device 200. The organic light emitting layer 170 is controlled to emit light by switching actions of the TFT 120 to apply voltages on the transparent conductive layer 150. Light emitted from the organic light emitting layer 170 is therefore filtered by the color filter array layer (as the red color filter layer 130 shown in the drawings) to be color light.

It is to be noted that the process for fabricating the color filter array layer of the foregoing AMOLED display device 200 having COA structure requires three times of procedures including coating color photoresistant layer, exposing and photolithography. Further, a process of patterning the flat layer 140 to configure the contact window opening 142 is needed for electrically connecting the TFT 120 with the transparent conductive layer 150. Furthermore, another procedure including coating and patterning processes is also needed for configuring a pixel defining layer 170, which is required for defining the pixel areas 162, in which the organic light emitting layers 170 are to be coated.

According to the foregoing, the fabrication of the conventional AMOLED display device 200 having COA structure is complicated and the production cost thereof is unlikely to be lowered.

SUMMARY OF THE INVENTION

Therefore, an object of the present invention is to provide a method for fabricating an AMOLED display device, which simplifies the fabricating process and lowers the production cost thereof.

Another object of the present invention is to provide an AMOLE display device fabricated with the foregoing method and thus improve the productivity.

For achieving the foregoing objects and others, the present invention provides a method for fabricating an AMOLED display device, which includes the following steps. First, a substrate is provided. After that, a device layer is configured on the substrate, wherein the device layer includes a plurality of active devices. Then, a flat layer is configured on the device layer. Then, a first color photoresistant layer is configured on the flat layer. Then, a first color filter layer is configured by patterning the first color photoresistant layer, and the first color filter layer has a first pixel area and a first opening. Next, a second color photoresistant layer is configured on the flat layer. A second color filter layer is then configured by patterning the second color photoresistant layer, and the second color filter layer has a second pixel area and a second opening. Then, a third color photoresistant layer is configured on the flat layer. A third color filter layer is then configured by patterning the third color photoresistant layer, and the third color filter layer has a third pixel area and a third opening. Then, the first, the second and the third color filter layers are used as masks, parts of the flat layer respectively under the first, the second and the third openings are removed for configuring a plurality of contact window openings for exposing parts of the active devices. Afterward, a first pixel electrode, a second pixel electrode and a third pixel electrode are respectively configured in the first, the second and the third pixel areas. The first pixel electrode, the second pixel electrode and the third pixel electrode are respectively electrically connected with the active devices via the contact window openings. Finally, a first organic light emitting layer, a second organic light emitting layer and a third organic light emitting layer are respectively configured on the first pixel electrode, the second pixel electrode and the third pixel electrode.

According to an embodiment of the invention, the foregoing process of patterning the first, the second and the third color photoresistant layers includes patterning the first, the second and the third color photoresistant layers with a half-tone mask.

According to an embodiment of the invention, the foregoing first color filter layer is a red color filter layer; the second color filter layer is a green color filter layer; and the third color filter layer is a blue color filter layer.

According to an embodiment of the invention, the foregoing first, second and third organic light emitting layers are different in composition, wherein the first organic light emitting layer is a red organic light emitting layer; the second organic light emitting layer is a green organic light emitting layer; and the third organic light emitting layer is a blue organic light emitting layer.

According to an embodiment of the invention, the foregoing first, second and third organic layers are identical in composition, wherein all of the first, the second and the third organic layers are white organic light emitting layers.

To achieve the foregoing objects and others, the present invention also provides an AMOLED display device. The AMOLED display device includes a substrate, a device layer, a flat layer, a first, a second, and a third color filter layers, a first, a second and a third pixel electrodes, a first, a second and a third organic light emitting layers. The device layer is configured on the substrate, and the device layer includes a plurality of active devices. The flat layer is configured on the device layer, and the flat layer includes a plurality of contact window openings for exposing parts of the foregoing active devices. The first color filter layer is configured on the flat layer, and the first color filter has a first pixel area and a first opening. Wherein, the first opening is configured above a part of the contact window openings. The second color filter layer is configured on the flat layer, and the second color filter layer has a second pixel area and a second opening. Wherein, the second opening is configured above a part of the contact window openings. The third color filter layer is configured on the flat layer, and the third color filter layer has a third pixel area and a third opening. The third opening is configured above a part of the contact window openings. The first, the second and the third pixel electrodes are disposed respectively in the first, the second and the third pixel areas. The first, the second and the third pixel electrodes are respectively electrically connected to the active devices via the contact window openings and the first, the second and the third openings, respectively. The first, the second and the third organic light emitting layers are respectively configured on the first, the second and the third pixel electrodes.

According to an embodiment of the invention, the foregoing first color filter layer is a red color filter layer; the second color filter layer is a green color filter layer; and the third color filter layer is a blue color filter layer.

According to an embodiment of the invention, the foregoing first, second and third organic light emitting layers are different in composition, wherein the first organic light emitting layer is a red organic light emitting layer; the second organic light emitting layer is a green organic light emitting layer; and the third organic light emitting layer is a blue organic light emitting layer.

According to an embodiment of the invention, the foregoing first, second and third organic layers are identical in composition, wherein all of the first, the second and the third organic layers are white organic light emitting layers.

According to an embodiment of the invention, the foregoing device layer further includes a plurality of scan lines and a plurality of data lines, by which the active devices can be driven.

According to an embodiment of the invention, the foregoing active devices includes TFTs. Each of the TFTs includes a silicon island, a gate-insulating layer, a gate electrode, a source/drain electrode, an inter-layer dielectric (ILD) layer, and a source/drain contact metal. The silicon island is disposed on the substrate, and the gate-insulating layer covers the silicon island. The gate electrode is configured on the gate-insulating layer above the silicon island, and the source/drain electrode are configured in the silicon island under two sides of the gate electrode. A channel area is defined between the source/drain electrode. The ILD layer is configured covering the gate electrode and exposes a part of the source/drain electrode. The source/drain contact metal is electrically connected respectively with the source/drain electrode. A lightly doped drain (LDD) area may be advantageously included between the channel area and the source/drain electrode.

According to an embodiment of the invention, the foregoing first, second and third pixel electrodes are made of indium tin oxide (ITO) or indium zinc oxide (IZO).

The present invention employs a half-tone mask to pattern the first, the second and the third color photoresistant layers, thus the subsequently obtained first, second and third color filter layers can be used as pixel defining layers and etching masks for making the contact window openings. The method for fabricating an AMOLED display device is adapted for simplifying fabricating procedures and lowering production cost by skipping over the process of making pixel defining layers and etching masks for making the contact window openings.

BRIEF DESCRIPTION OF THE DRAWINGS

The features of the invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DESCRIPTION OF THE EMBODIMENTS

FIGS. 2A through 2H are schematic cross-sectional views illustrating a process for fabricating an AMOLED display device according to an embodiment of the present invention. Referring to FIGS. 2A through 2H, the method for fabricating an AMOLED display device according to an embodiment of the present invention is illustrated as below.

Figure 2A:
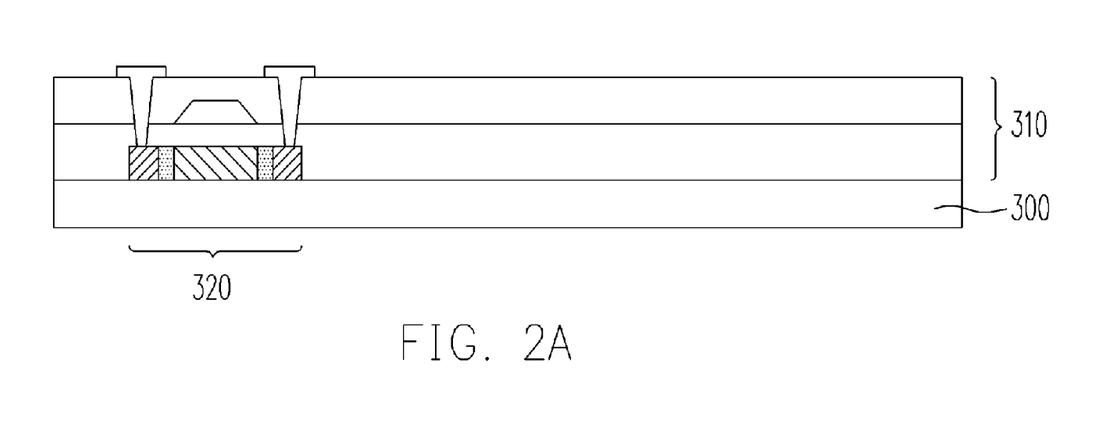
FIGS. 2A through 2H are schematic cross-sectional views illustrating a process for fabricating an AMOLED display device according to an embodiment of the present invention.

First, a substrate 300 is provided as shown in FIG. 2A. The substrate 300, for example, is glass substrate, quartz substrate or flexible substrate. Then, referring to FIG. 2A again, a device layer 310 is configured on the substrate. The device layer 310 includes a plurality of active devices 320 (only one shown in FIG. 2A). According to an embodiment of the invention, the active devices 320, for example, are thin film transistors (TFTs). And, the device layer 310 includes a plurality of scan lines (not shown) and data lines (not shown), by which the active devices 320 can be driven. The method for forming the device layer 310 is utilized by normal semiconductor process and will not be described in detail.

Figure 2B:
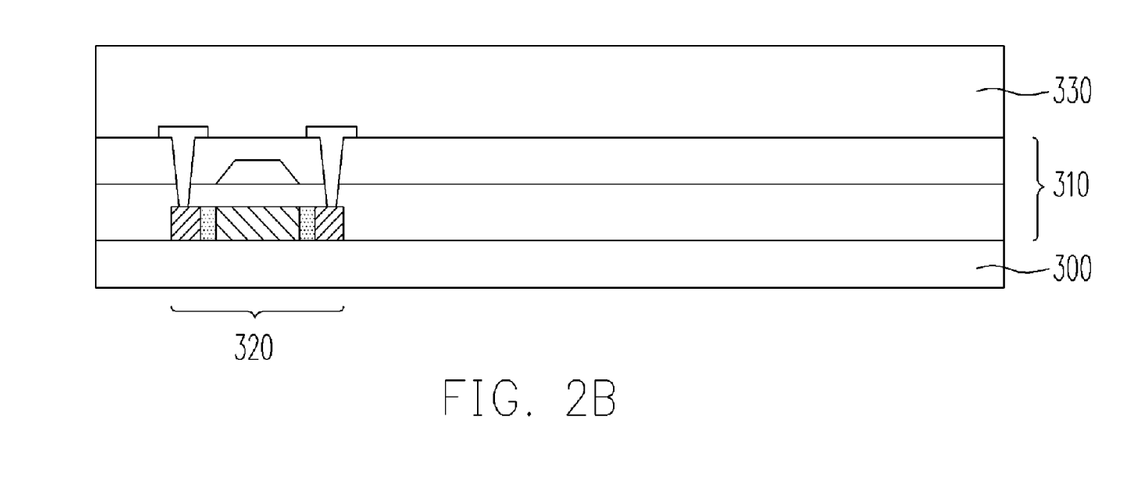

A flat layer 330 is then configured on the device layer 310, as illustrated in FIG. 2B. According to an embodiment, chemical vapor deposition (CVD) is used for configuring the flat layer 330, and the material of the flat layer 330, for example, is silicon dioxide, silicon nitride or silicon nitride oxide.

Figure 2C:
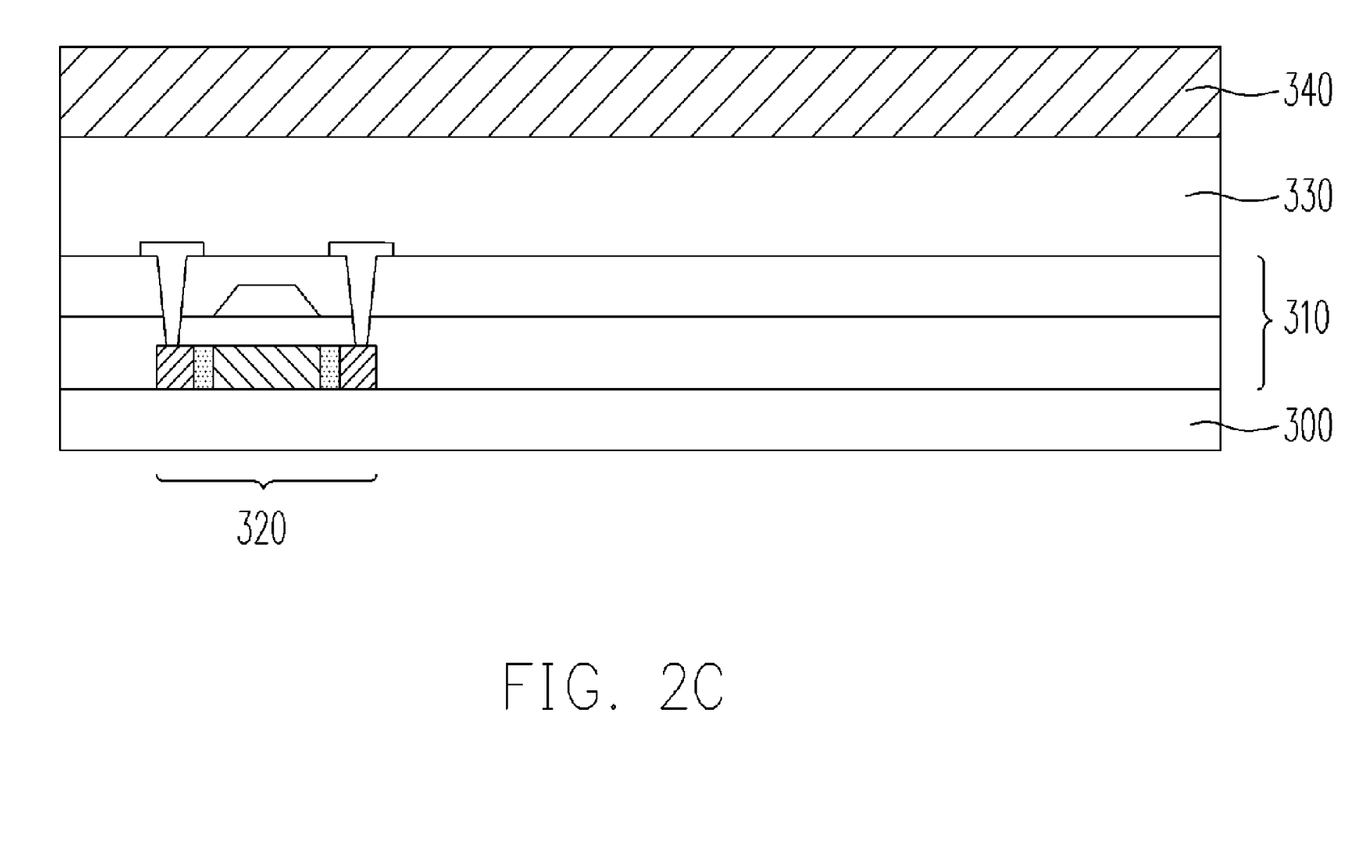

Turning to FIG. 2C, a first color photoresistant layer 340 is configured on the flat layer 330. According to an embodiment, the method for configuring the first color photoresistant layer 340, for example, is spin coating or evaporation, and the material of the first color photoresistant layer 340, for example, is a polymer material.

Figure 2D:
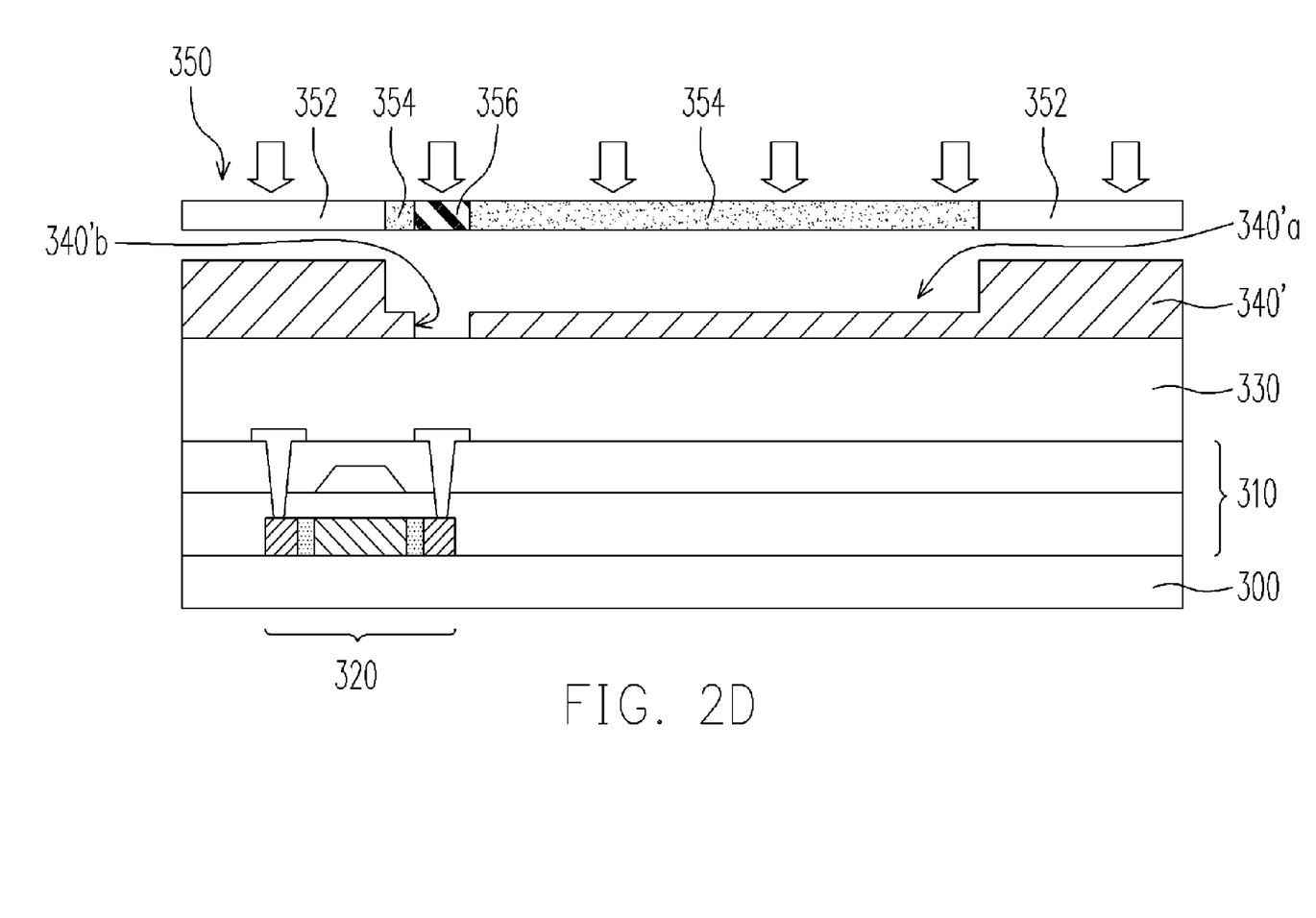

Then, the first color photoresistant layer 340 is patterned to configure a first color filter layer 340' and to defines a first pixel area 340'a, and the first color filter layer 340' has a first opening 340'b as shown in FIG. 2D. According to an embodiment of the invention, the first color photoresistant layer 340 is patterned, for example, with a half-tone mask 350.

As illustrated in FIG. 2D, the half-tone mask 350, for example, includes an exposing area 352, a half-tone area 354 and a light shading area 356. The first color photoresistant layer 340 can be either a negative type photoresist or a positive type photoresist. If the first color photoresistant layer 340 is a negative type photoresist, after a photolithography processing is performed to the first color photoresistant layer 340 using the half-tone mask 350 as an optical mask, parts of the first color photoresistant layer 340 corresponding to the exposing area 352 are intact; some other parts of the first color photoresistant layer 340 corresponding to the half-tone area 354 are partly removed to configure the first pixel area 340a'; and the other parts of the first color photoresistant layer 340 corresponding to the light shading area 356 are entirely removed to configure the first opening 340b', thus obtaining the first color filter layer 340'. Besides, according to another embodiment of the invention, the first color photoresistant layer 340 can be patterned to form the first color filter layer 340' shown in FIG. 2D by two or more optical masks with different exposure energy.

Figure 2E:
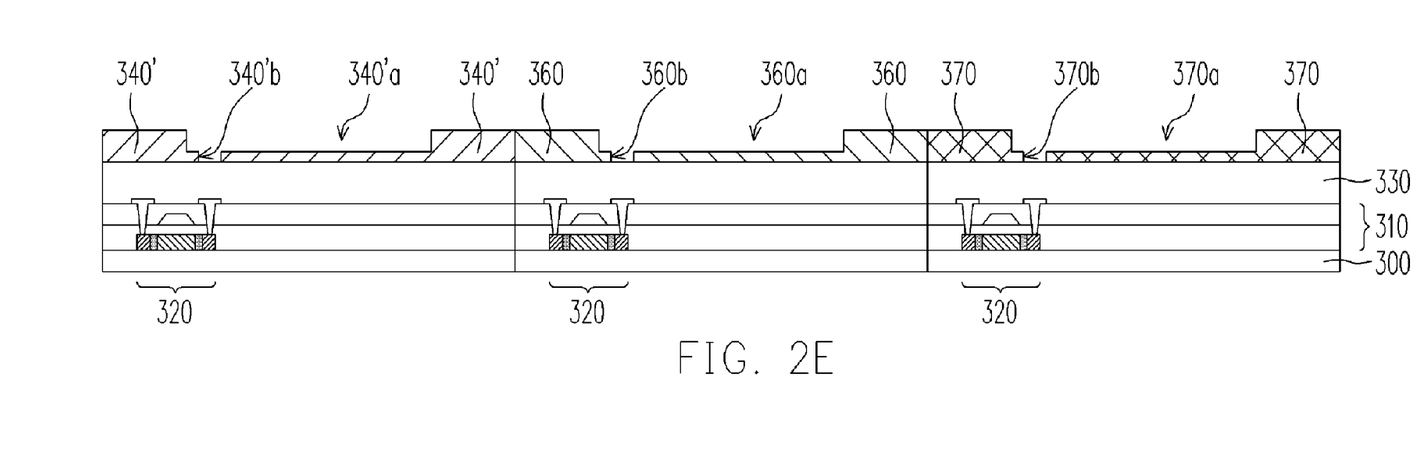

Next, the steps illustrated in FIGS. 2C and 2D are repeated to configure a second color photoresistant layer (not shown) on the flat layer 330 and to subsequently configure a second color filter layer 360 by patterning the second color photoresistant layer with the half-tone mask 350. Similarly, a third color photoresistant layer (not shown) is further configured of the foregoing on the flat layer 330 and a third color filter layer 370 is then subsequently configured by patterning the third color photoresistant layer with the half-tone mask 350, and thus a structure of color filter on array (COA) as shown in FIG. 2E is configured. In a same manner, the second color filter layer 360 defines a second pixel area 360a and has a second opening 360b, and the third color filter layer 370 defines a third pixel area 370a and has a third opening 370b. According to an embodiment of the invention, the first color filter layer 340' is a red color filter layer; the second color filer layer 360 is a green color filter layer; and the third color filter layer 370 is a blue color filter layer, all of which configure a color filter array layer.

It is to be noted that the first, the second and the third color filter layers 340', 360 and 370 made by the steps of photoresist coating, exposing and photolithography with the half-tone mask 350 are not only functioned as color filters, but also used as pixel defining layer for defining a plurality of first, second and third pixel areas 340'a, 360a and 370a.

Figure 2F:
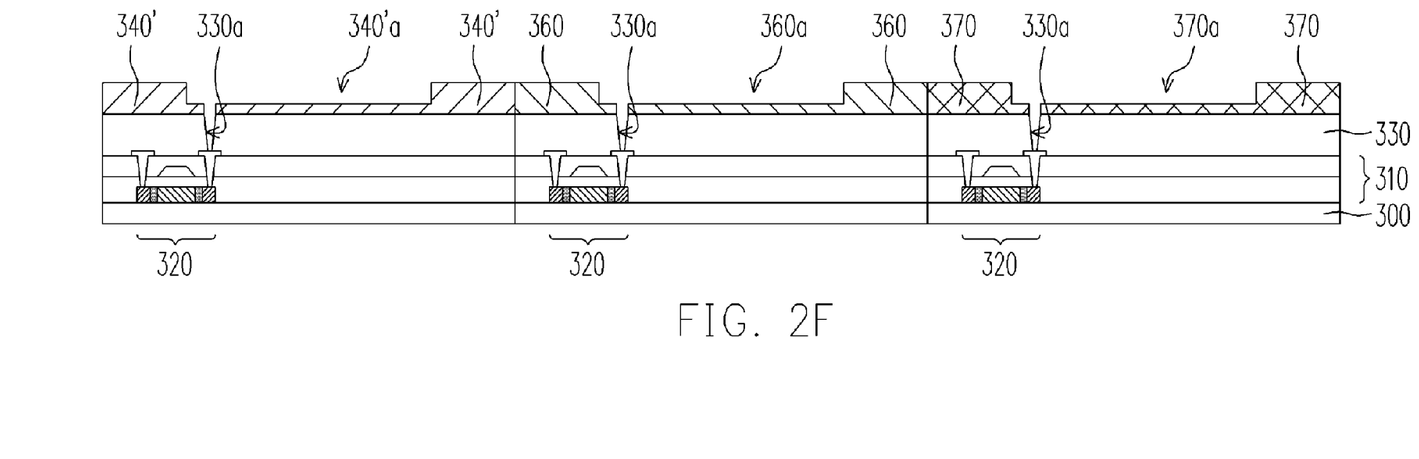

Then, the first, the second and the third color filter layers 340', 360 and 370 are used as masks to remove parts of the flat layer 330 under the first, the second and the third openings 340'b, 360b and 370b for configuring a plurality of contact window openings 330a. The contact window openings 330a expose parts of the active devices 320 as illustrated in FIG. 2F. According to an embodiment of the invention, the method for removing the parts of the flat layer 330, for example, is either dry etching or wet etching.

It is to be noted that having the first, the second and the third color filter layers 340', 360 and 370 having the first, the second and the third openings 340'b, 360b and 370b can be used as etching masks for making the contact window openings 330a. As a result, comparing with the conventional technology shown in FIG. 1C, the present invention skips a step of patterning the photoresistant layer for making the contact window openings 330a, thus the procedures of the present invention is relatively simple.

Figure 2G:
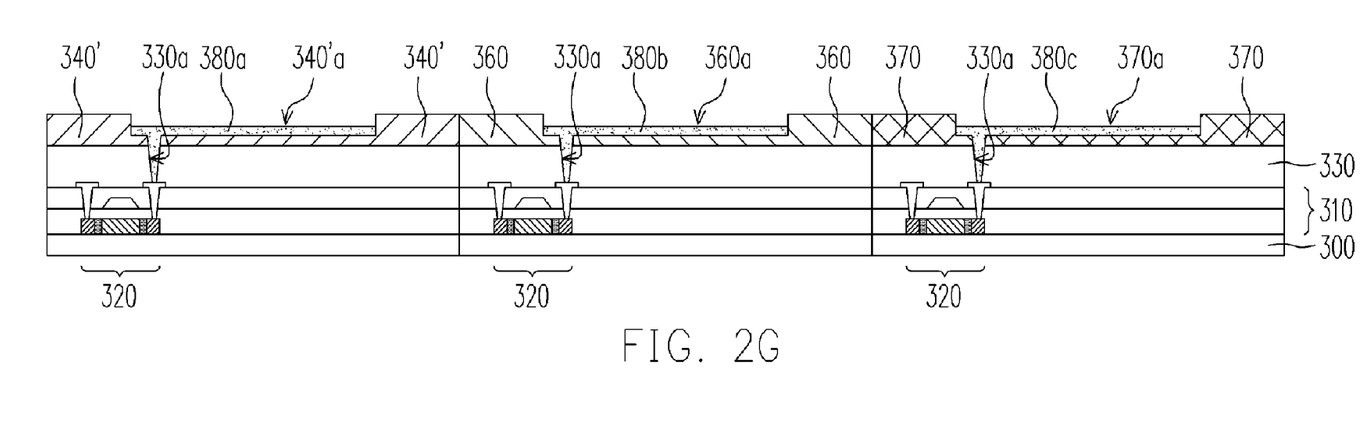

Next, as illustrated in FIG. 2G, a first, a second and a third pixel electrodes 380a, 380b and 380c are respectively configured in the first, the second and the third pixel areas 340'a, 360a and 370a; the first, the second and the third pixel electrodes 380a, 380b and 380c are electrically connected to the active devices 320 respectively via the contact window openings 330a. According to an embodiment of the invention, the method for configuring the first, the second and the third pixel electrodes 380a, 380b and 380c, for example, is sputtering a transparent conductive layer (not shown) onto the substrate 300 and then patterning the transparent conductive layer and therefore configuring the first, the second and the third pixel electrodes 380a, 380b and 380c. The material of the transparent conductive layer, for example, is either indium tin oxide (ITO) or indium zinc oxide (IZO).

Figure 2H:
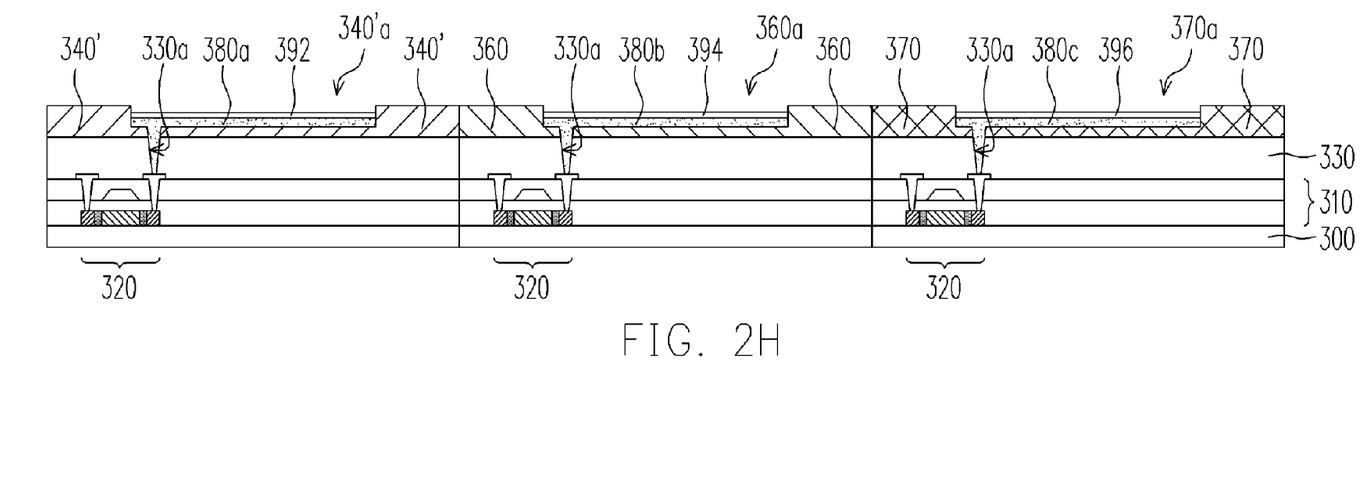

Now turning to FIG. 2H, a first, a second and a third organic light emitting layers 392, 394 and 396 are respectively configured on the first, the second and the third pixel electrodes 380a, 380b and 380c. According to an embodiment of the invention, the method for configuring the first, the second and the third pixel electrodes 380a, 380b and 380c, for example, is evaporation.

Referring to FIG. 2H, the first, the second and the third organic light emitting layers 392, 394 and 396 can be different in composition, i.e., the colors of the above organic light emitting layers 392, 394 and 396 can be different. And the first, the second and the third organic light emitting layers 392, 394 and 396 are preferably configured in corresponding to the colors of respectively the first, the second and the third color filter layers 340', 360 and 370. According to an embodiment of the invention, the first organic light emitting layer 392 is a red organic light emitting layer; the second organic light emitting layer 394 is a green organic light emitting layer; and the third organic light emitting layer 396 is a blue organic light emitting layer, thus a better color saturation performance can be achieved.

According to another embodiment of the invention, the first, the second and the third organic light emitting layers 392, 394 and 396 can also be identical in composition, i.e., the colors of the above organic light emitting layers 392, 394 and 396 can be identical. The first, the second and the third organic light emitting layers 392, 394 and 396 can be white organic light emitting layers or organic light emitting layers of other colors. Therefore, the production procedure can be simplified and the production cost can be lowered accordingly.

In view of the foregoing, the present invention employs a half-tone mask for patterning the first, the second and the third color photoresistant layers, thus the subsequently obtained first, second and third color filter layers can be used as pixel defining layers and etching masks for making the contact window openings. In comparison with the conventional technologies, the procedure of the method for fabricating an AMOLED display device is simplified and the production cost is reduced by skipping over the process of making pixel defining layers and etching masks for making the contact window openings.

Figure 3:
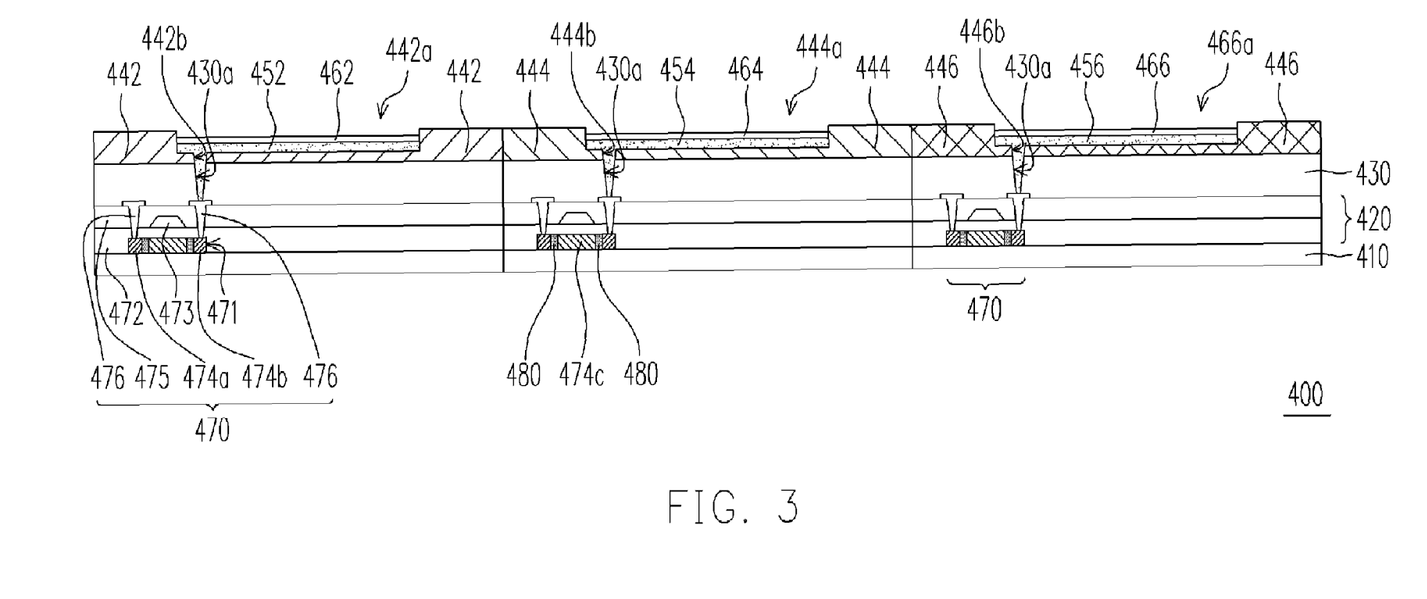
FIG. 3 is a schematic cross-sectional view of an AMOLED display device according to an embodiment of the present invention.

FIG. 3 is a schematic cross-sectional view of an AMOLED display device according to an embodiment of the present invention. Such an AMOLED display device 400 includes a substrate 410, a device layer 420, a flat layer 430, a first, a second and a third color filter layers 442, 444 and 446, a first, a second and a third pixel electrodes 452, 454 and 456, and a first, a second, a third organic light emitting layers 462, 464 and 466.

Referring to FIG. 3, the device layer 420 is configured on the substrate 410, and the device layer 420 includes a plurality of active devices 470. According to an embodiment of the invention, the device layer 420 further includes a plurality of scan lines (now shown) and a plurality of data lines (not shown), by which the active devices 470 are driven. The active devices 470 are, for example, TFTs. According to an embodiment of the invention, each of the TFTs includes a silicon island 471, a gate-insulating layer 472, a gate electrode 473, a source/drain electrode 474a/474b, an inter-layer dielectric (ILD) layer 475, and source/drain contact metals 476. The silicon island 471 is disposed on the substrate 410, and the gate-insulating layer 472 covers the silicon island 471. The gate electrode 473 is configured on the gate-insulating layer 472 above the silicon island 471, and the source/drain electrode 474a/474b are configured in the silicon island 471 under two sides of the gate electrode 473. A channel area 474c is defined between the source/drain electrode 474a/474b. The ILD layer 475 is configured covering the gate electrode 473 and exposing a part of the source/drain electrode 474a/474b. The source/drain contact metals 476 are respectively electrically connected with the source/drain electrode 474a/474b. Besides, a lightly doped drain (LDD) area 480 may be advantageously included between the channel area 474c and the source/drain electrode 474a/474b.

The flat layer 430 is configured on the device layer 420, and the flat layer 430 includes a plurality of contact window openings 430a for exposing parts of the foregoing active devices 470. According to an embodiment of the invention, the material of the flat layer 430, for example, is silicon dioxide, silicon nitride or silicon nitride oxide.

The first color filter layer 442 is configured on the flat layer 430, and the first color filter layer 442 has a first pixel area 442a and a first opening 442b. The first opening 442b is configured above a part of the contact window openings 430a. The second color filter layer 444 is configured on the flat layer 430, and the second color filter layer 444 has a second pixel area 444a and a second opening 444b. The second opening 444b is configured above a part of the contact window openings 430a. The third color filter layer 446 is configured on the flat layer 430, and the third color filter layer 446 has a third pixel area 446a and a third opening 446b. The third opening 446b is configured above a part of the contact window openings 430a.

According to an embodiment of the invention, the first color filter layer 442 is a red color filter layer; the second color filer layer 444 is a green color filter layer; and the third color filter layer 446 is a blue color filter layer, all of which compose a color filter array layer. It is to be noted that the color filter array layer composed of the first, the second and the third color filter layers 442, 444 and 446 are not only functioned as color filters, but also used as pixel defining areas for defining a plurality of first, second and third pixel areas 442a, 444a and 446a. Further, the color filter array layer can even be used as an etching mask for making the contact window openings 430a.

Referring to FIG. 3, the first, the second and the third pixel electrodes 452, 454 and 456 are disposed respectively in the first, the second and the third pixel areas 442a, 444a and 446a. The first, the second and the third pixel electrodes 452, 454 and 456 are respectively electrically connected to the active devices 470 via the contact window openings 430a and the first, the second and the third openings 442b, 444b and 446b respectively. According to an embodiment of the invention, the first, the second and the third pixel electrodes 452, 454 and 456 are made of indium tin oxide ITO or indium zinc oxide IZO.

The first, the second and the third organic light emitting layers 462, 464 and 466 are respectively configured on the first, the second and the third pixel electrodes 452, 454 and 456. According to an embodiment of the invention, the first, the second and the third organic light emitting layers 462, 464 and 466 can be different in composition, i.e., the colors of the above organic light emitting layers 462, 464 and 466 can be different, wherein the first organic light emitting layer 462 is a red organic light emitting layer; the second organic light emitting layer 464 is a green organic light emitting layer; and the third organic light emitting layer 466 is a blue organic light emitting layer, thus a better color saturation performance can be achieved.

According to another embodiment of the invention, the first, the second and the third organic light emitting layers 462, 464 and 466 can also be identical in composition, i.e., the colors of the above organic light emitting layers 462, 464 and 466 can be identical. The first, the second and the third organic light emitting layers 462, 464 and 466, for example, are white organic light emitting layers. Therefore, organic light emitting color filter layers of identical white color can be evaporated at the same time, thus the production procedure is simplified and the production cost is lowered accordingly.

In summary, the method for fabricating an AMOLED display device and the structure of such device according to the present invention has at least the following advantages:

1. The present invention is adapted for skipping over the step of making pixel defining layers and the step of making etching masks for making the contact window openings, thus the present invention simplifies the fabricating process and lowers the production cost;

2. Incorporating with organic light emitting layers of different colors, the color filter layers are able to enhance the color saturation performance;

3. Organic light emitting layers of same color (white) can also be used according to the present invention for further lowering the production cost.

Other modifications and adaptations of the above-described preferred embodiments of the present invention may be made to meet particular requirements. This disclosure is intended to exemplify the invention without limiting its scope. All modifications that incorporate the invention disclosed in the preferred embodiment are to be construed as coming within the scope of the appended claims or the range of equivalents to which the claims are entitled.

What is claimed is:

1. A method for fabricating an active matrix organic light emitting diode (AMOLED) display device, comprising:
   providing a substrate;
   configuring a device layer on the substrate, wherein the device layer comprising a plurality of active devices;
   configuring a flat layer on the device layer;
   configuring a first color photoresistant layer on the flat layer;
   patterning the first color photoresistant layer to configure a first color filter layer and to define a first pixel area, and the first color filter layer having a first opening;
   configuring a second color photoresistant layer on the flat layer;
   patterning the second color photoresistant layer to configure a second color filter layer and to define a second pixel area, and the second color filter layer having a second opening;
   configuring a third color photoresistant layer on the flat layer;
   patterning the third color photoresistant layer to configure a third color filter layer and to define a third pixel area, and the third color filter layer having a third opening, wherein the process of patterning the first, the second and the third color photoresistant layers comprises respectively patterning the first, the second and the third color photoresistant layers with a half-tone mask;
   using the first, the second and the third color filter layers as masks for removing parts of the flat layer respectively under the first, the second and the third openings for configuring a plurality of contact window openings for exposing parts of the active devices;
   configuring a first pixel electrode, a second pixel electrode and a third pixel electrode respectively in the first, the second and the third pixel areas, the first pixel electrode, the second pixel electrode and the third pixel electrode being respectively electrically connected with the active devices via the contact window openings; and
   configuring a first organic light emitting layer, a second organic light emitting layer and a third organic light emitting layer respectively on the first pixel electrode, the second pixel electrode and the third pixel electrode.

2. The method according to claim 1, wherein the first color filter layer is a red color filter layer; the second color filter layer is a green color filter layer; and the third color filter layer is a blue color filter layer.

3. The method according to claim 1, wherein the first, the second and the third organic light emitting layers are different in composition.

4. The method according to claim 3, wherein the first organic light emitting layer is a red organic light emitting layer; the second organic light emitting layer is a green organic light emitting layer; and the third organic light emitting layer is a blue organic light emitting layer.

5. The method according to claim 1, wherein the first, the second and the third organic light emitting layers are identical in composition.

6. The method according to claim 5, wherein the first, the second and the third organic light emitting layers are white organic light emitting layers.

* * * * *